United States Patent [19]

Stevens et al.

[11] Patent Number: 5,235,198

[45] Date of Patent: Aug. 10, 1993

[54] NON-INTERLACED INTERLINE TRANSFER CCD IMAGE SENSING DEVICE WITH SIMPLIFIED ELECTRODE STRUCTURE FOR EACH PIXEL

[75] Inventors: Eric G. Stevens, Rochester; David L. Losee, Fairport; Edward T. Nelson, Pittsford; Timothy J. Tredwell, Fairport, all of N.Y.

[73] Assignee: Eastman Kodak Company, Rochester, N.Y.

[21] Appl. No.: 869,097

[22] Filed: Apr. 14, 1992

Related U.S. Application Data

[63] Continuation of Ser. No. 631,807, Dec. 21, 1990, abandoned, which is a continuation-in-part of Ser. No. 443,536, Nov. 29, 1989, abandoned.

[51] Int. Cl.⁵ .................... H01L 29/78; H01L 27/16; H01L 31/00
[52] U.S. Cl. .................... 257/232; 257/233; 257/236; 257/243; 257/248; 257/250
[58] Field of Search ............... 357/24 LR, 24, 24 M; 257/232, 233, 236, 243, 248, 250

[56] References Cited

U.S. PATENT DOCUMENTS

| | | | |
|---|---|---|---|
| 4,330,796 | 5/1982 | Anagnostopoulos et al. | 358/213 |
| 4,521,797 | 6/1985 | Oda | 357/24 LR |
| 4,608,749 | 9/1986 | Harada et al. | 357/24 LR |
| 4,613,402 | 9/1986 | Losee et al. | 156/643 |
| 4,638,361 | 1/1987 | Takeshita | 358/213 |
| 4,851,887 | 7/1989 | Hagiwara | 357/24 LR |
| 4,908,518 | 3/1990 | Losee et al. | 357/24 LR |
| 4,982,252 | 1/1991 | Matsunaga | 357/24 LR |

FOREIGN PATENT DOCUMENTS

| | | | |
|---|---|---|---|
| 0100199 | 2/1984 | European Pat. Off. | 357/24 LR |
| 148786 | 1/1985 | European Pat. Off. | |
| 0148786 | 7/1985 | European Pat. Off. | 357/24 LR |
| 3640434 | 6/1987 | Fed. Rep. of Germany | 357/24 LR |
| 62-293762 | 12/1987 | Japan | 357/24 LR |

OTHER PUBLICATIONS

Technical Digest, IEDM, 1988, pp. 70–73.
IEEE Electron Device Letters, vol. 10, No. 8, pp. 361–363, Aug. 1989.
J. Electrochemical Soc., vol. 135, p. 2640, Oct. 1988.

Primary Examiner—Andrew J. James
Assistant Examiner—Ngan Van Ngo
Attorney, Agent, or Firm—Raymond L. Owens

[57] ABSTRACT

An interline transfer type area image sensor which operates in a non-interlaced mode and has an array of columns and rows of photoreceptor in which charge from each pixel is transferred into a stage of a vertical two-phase CCD shift register formed by adjacent electrodes of the CCD. Each electrode of a stage has a separate voltage clock. An ion implanted vertical transfer barrier region is formed under an edge of each electrode.

10 Claims, 5 Drawing Sheets

NON-INTERLACED INTERLINE TRANSFER CCD IMAGE SENSING DEVICE WITH SIMPLIFIED ELECTRODE STRUCTURE FOR EACH PIXEL

CROSS REFERENCE TO RELATED APPLICATIONS

This is a continuation of application Ser. No. 631,807, filed Dec. 21, 1990, now abandoned which is a continuation-in-part of Ser. No. 443,536 filed Nov. 29, 1989 now abandoned.

REFERENCE TO CO-PENDING PATENT APPLICATION

Reference is made to commonly assigned U.S. patent application Ser. No. 309,646 entitled Interline Transfer CCD Image Sensing Device With Electrode Structure for Each Pixel to Losee et al, filed Feb. 10, 1989.

FIELD OF THE INVENTION

This invention relates to image sensing devices and, more particularly, to interline transfer type charge coupled imagers with non-interlaced or progressive scan read-out.

BACKGROUND OF THE INVENTION

In interline transfer type imaging devices, photogenerated charge is collected on a photo charge collection site or photoreceptor, such as in a photodiode pn junction or under the gate of a photocapacitor, for a period of time and then transferred into a charge coupled register to be detected by an output circuit. In an area array of such photocharge collection sites it is necessary to transfer the collected photocharge, first into a vertical shift register and then to a horizontal shift register, finally, reaching a charge sensitive detector or amplifier. In prior art devices such as disclosed by Oda, U.S. Pat. No. 4,521,797, a vertical shift register is composed of electrode pairs, each of which is formed by a charge storage electrode and a potential barrier electrode, which are arranged so that a charge storage electrode of one pair is connected to a potential barrier electrode of an adjacent pair, to receive the same clock pulse. Such a vertical shift register may then be operated using only two vertical clock sources. FIG. 1 shows, schematically, a plan view of a portion of the light sensing section of such a prior art device. Reference may also be made to FIGS. 2 and 4 of Oda for a more detailed plan view of such a prior art device. Furthermore, in the device disclosed by Oda, a separate transfer gate electrode, which he labels $\Phi_s$, is clocked to transfer photogenerated charge from the photodiode regions into the CCD shift register. Upon further examination of the device disclosed by Oda it will be realized that the vertical CCD shift register is, in actuality, composed of four conductive elements for each complete stage of the shift register. Referring now to FIG. 1, photodiodes, labeled $D_{ij}$, where index number i refers to the ith row and j refers to the jth column in an array of such photodiodes, collect charge generated by incident light. After a period of light exposure the photogenerated charges which have been collected by diodes $D_{ij}$ are transferred to the corresponding storage regions of the vertical shift register, $S_{ij}$, for subsequent shifting to charge detection circuitry. One complete stage of the vertical shift register is then composed of storage region $S_{ij}$ and barrier region $B_{ij}$ both controlled by, say, a $\Phi_1$ clock, and storage region $S_{i+1,j}$ and barrier region $B_{i+1,j}$ are controlled by clock $\Phi_2$. In the device described by Oda, a separately clocked transfer gate electrode transfers charges from each diode, $D_{ij}$, to its corresponding storage region $S_{ij}$. This transfer operation is indicated by the arrows in FIG. 1. However, again referring to FIG. 1, in the subsequent transferring of the photocharges through the vertical shift register, charge from a given row $m-1$ must be combined with charge from row m, charge from row $m+1$ with that from row $m+2$, etc. This is because one complete stage of the vertical CCD register is composed of a pair of storage regions and their associated barrier regions. This places a limitation on the modes of operation of the device and limits the vertical resolution obtainable in a single charge collection interval.

FIG. 2 shows a more detailed but still schematic cross sectional view of the vertical shift register of the device of FIG. 1, taken along line A—A. Here, semiconductor substrate 70 is provided with a buried channel region 40 and covered with an insulating layer 80. Charge storage electrodes 20 and 50 are formed and additional doping is provided in the regions 65 between electrodes 20 and 50. Additional insulation is formed over electrodes 20 and 50 and overlapping electrodes 30 and 60 are formed. The doping 65 creates barrier regions 25 and 55 in the buried channel and regions 26 and 56 are storage regions. Then, in a manner similar to that described by Oda, clock voltages $\Phi_1$ and $\Phi_2$ are connected to the electrode pair 20 and 30 and to the electrode pair 50 and 60, respectively. Thus, the four electrode elements, 20, 30, 50 and 60 comprise one full stage of a two-phase vertical shift register. During charge transfer, any charge that is held in storage region 56 is transferred to storage region 26 when $\Phi_2$ is at a low voltage and $\Phi_1$ is at a higher voltage. Any charge accumulated in region 26 is held there by the high $\Phi_1$ voltage. Thus, if region 56 corresponds to row $m-1$ of FIG. 1 and if region 26 corresponds to row m, then charges from these two rows are combined when vertical clocking commences and the vertical resolution of the device is diminished. Thus, the vertical resolution of the device is limited by, among other factors, the design tolerances associated with the fabrication of a vertical shift register with four separate conductive elements per shift register stage.

A two-phase vertical shift register device has also been disclosed by Yaushira (Japanese Patent 62-293762) where charges from alternate rows of photodiodes are transferred to the vertical shift register and read out in a first field. Then, the charges from the intervening rows of photodiodes are transferred to the vertical register and read out. This alternate line read-out in two fields is termed an interlaced read out and is suitable for video applications but, as discussed, for example, by Brosiers et al (Technical Digest, IEDM, 1988, pp. 70-73), such a read out is not suitable for electronic still photography. For electronic still photography applications, in order to prevent blur from scene motions, the light produced charges should be read out at a single time, not in two fields. However, for a single field of either of the above-described prior art devices, the vertical resolution is in each case limited by the requirement that the vertical shift register be composed of four separate conductive elements per shift register stage.

Other prior art devices, such as disclosed by Miyatake (European patent application 0148786, Jul. 17, 1985), have utilized a four-phase vertical shift register where alternate rows of photodiodes are read out into the vertical register and then read out in two fields. Again, the vertical resolution in this case is limited by the requirement that the vertical shift register be composed of four separate conductive elements per shift register stage.

Image sensing devices for applications to electronic still photography require all picture elements, or pixels, to be exposed during the same exposure interval. In order to operate an electronic camera without the use of a mechanical shutter it is necessary to simultaneously collect photogenerated charge, say on an array of photodiodes, and then after a suitable exposure interval, transfer the photogenerated charge to a shift register for storage and sequential read out. An interline transfer CCD type device which performs such a function would transfer photocharges from all of an array of photodiodes simultaneously into corresponding vertical shift register storage regions. Then, the photocharges are transferred, line by line, to a horizontal CCD shift register and then to a detector circuit. Clearly, the integrity of the separate photocharges from each diode must be maintained in order to maintain the maximum resolution in the detected image. This integrity is achieved in a device, where each line is read out in sequence, is called a non-interlaced device or a progressive scan device. This mode of operation is not possible with prior art devices such as discussed above. Alternatively, if three levels of overlapping electrodes are employed with a three-phase clocking sequence, such as disclosed by Tsaur et al in IEEE Electron Device Letters, 10, 361-363, 1989, a non-interlaced read-out may be achieved but at the expense of additional process and system complexity and a sacrifice of available photosensitive area.

In U.S. Pat. No. 4,330,796, Anognostopoulos et al disclose a non-interlaced interline transfer type CCD image sensor which employs three electrodes per pixel and a "meander channel" CCD which occupies a large fraction of the total picture element, or pixel, area. However, as discussed in Losee et al, U.S. Pat. No. 4,613,402, if the barrier region implants in the meander channel CCD are not precisely aligned, parasitic potential wells or barriers will be present in the CCD, thus leading to transfer inefficiency and poor performance.

SUMMARY OF THE INVENTION

It is the object of this invention to provide an image sensor with simplified pixel design which may be operated in a non-interlaced or progressive scan mode. It is a further object of this invention to provide such an image sensor with reduced pixel dimensions. It is a further object of this invention to provide a non-interlaced image sensor with a more efficient use of pixel area.

The above objects are achieved in an interline transfer type area image sensor having an array of columns and rows of separate photodiodes and wherein charge collected in each of the photodiodes of each column is transferred into a vertical two-phase CCD, such CCD shift register comprising a series of overlapping electrodes, with each electrode being formed from a single level of conductor, separate voltage clocks connected to alternate electrodes, adjacent pairs of said electrodes constituting one complete stage of a CCD shift register, each column photodiode being associated with one pair of a vertical CCD's electrodes, an ion implanted vertical transfer barrier region being formed under an edge of each electrode, and means for transferring charge from each photodiode into a region under one of the corresponding electrodes.

The present invention employs a two-phase CCD shift register which utilizes only one electrode for each clock phase, thus realizing a simplified non-interlaced read-out type device with improved ratio of photosensitive area to total pixel area. This is accomplished by providing a vertical CCD shift register with ion implanted transfer barrier regions such that only one conductive layer of gate electrode is required by each phase of the vertical shift register. The design requires only two electrodes for each row of imaging sites and such a structure is not as subject to yield limitations due to intralevel short circuits, such as those caused by photomasking imperfections. This invention, with only two conductive elements for each complete stage of the vertical CCD shift register, is to be contrasted with prior art devices which require four conductive elements per stage as discussed above. This simplification of structure then allows a higher resolution device to be constructed without a change in design rule minimum dimensions, i.e., a more manufacturable device. Self-alignment of the transfer barrier region implants assure excellent transfer efficiency in the CCD shift register.

DESCRIPTION OF THE INVENTION

Figure 1:
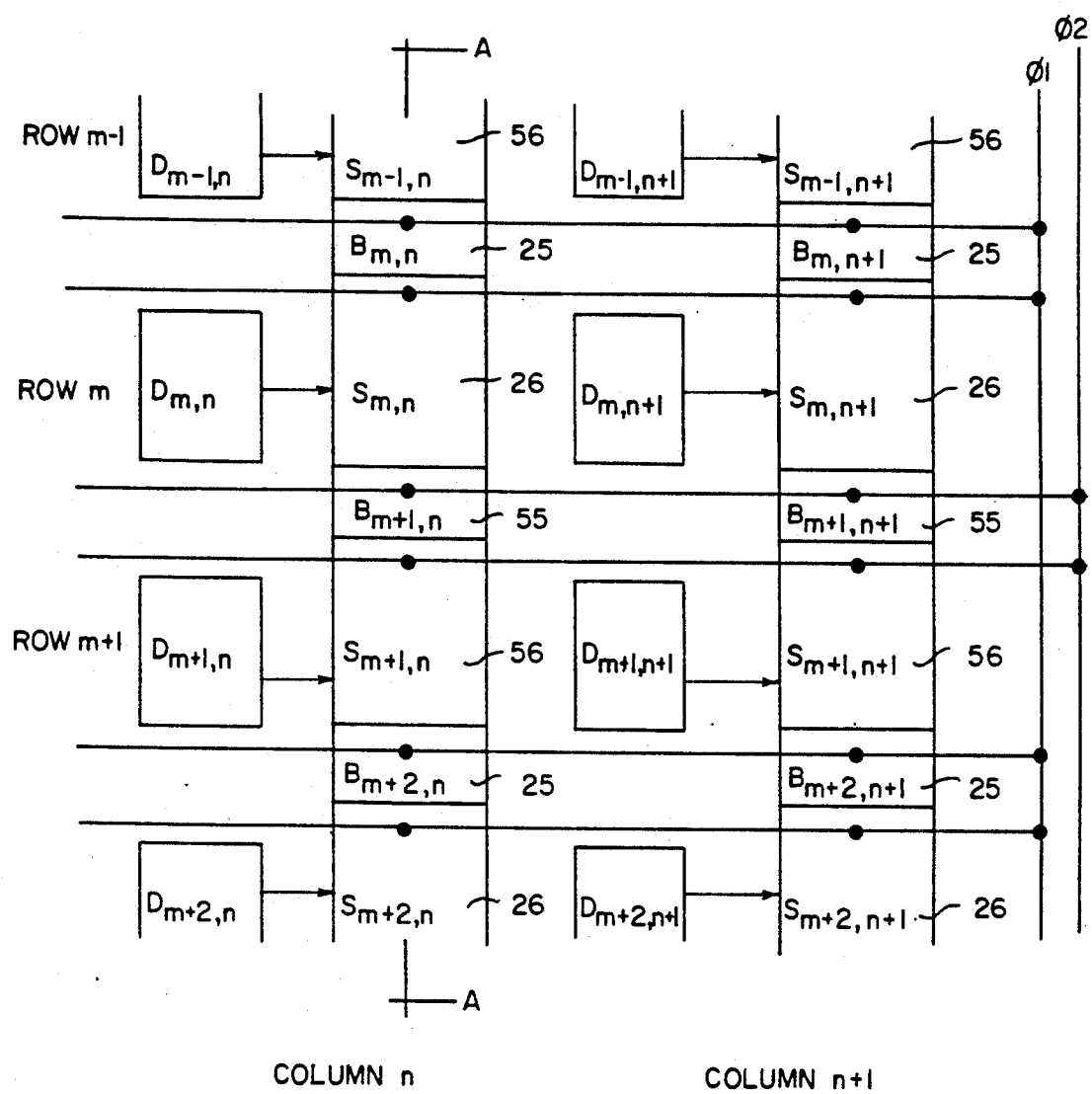
FIG. 1 is a schematic plan view of a portion of a prior art imaging device.
Figure 2:
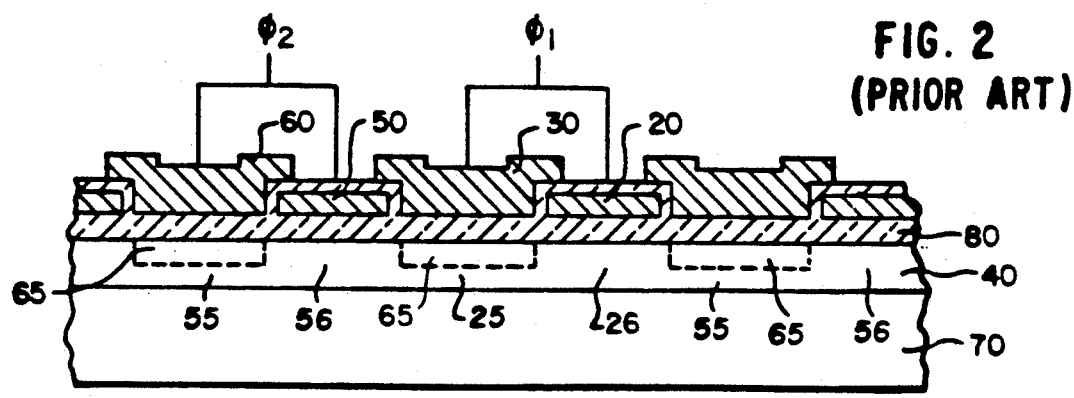
FIG. 2 is a fragmentary, partially schematic vertical section view through a semiconductor device, taken along the lines A—A of FIG. 1, illustrating a typical prior art construction.
Figure 3A:
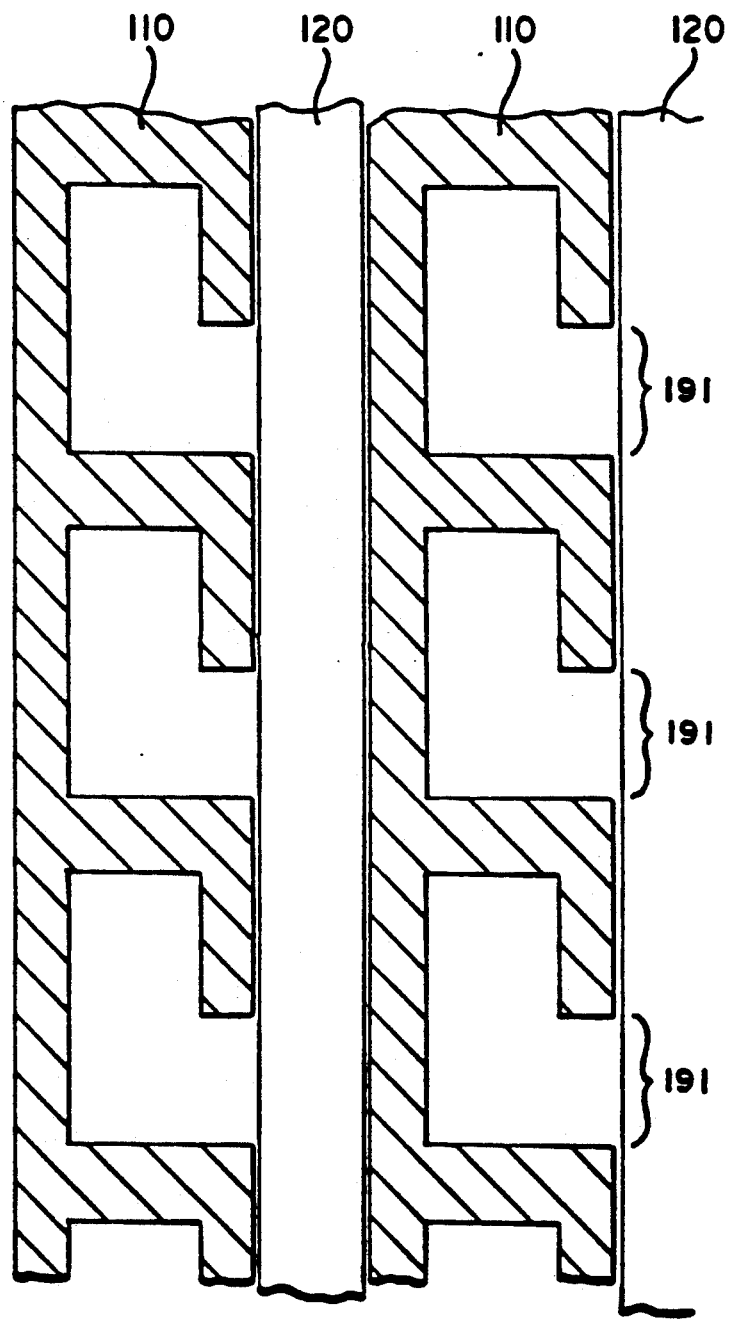
FIG. 3a through FIG. 3c are partial plan views of various stages during the making of an interline transfer type area image sensor in accordance with the present invention.
Figure 3B:
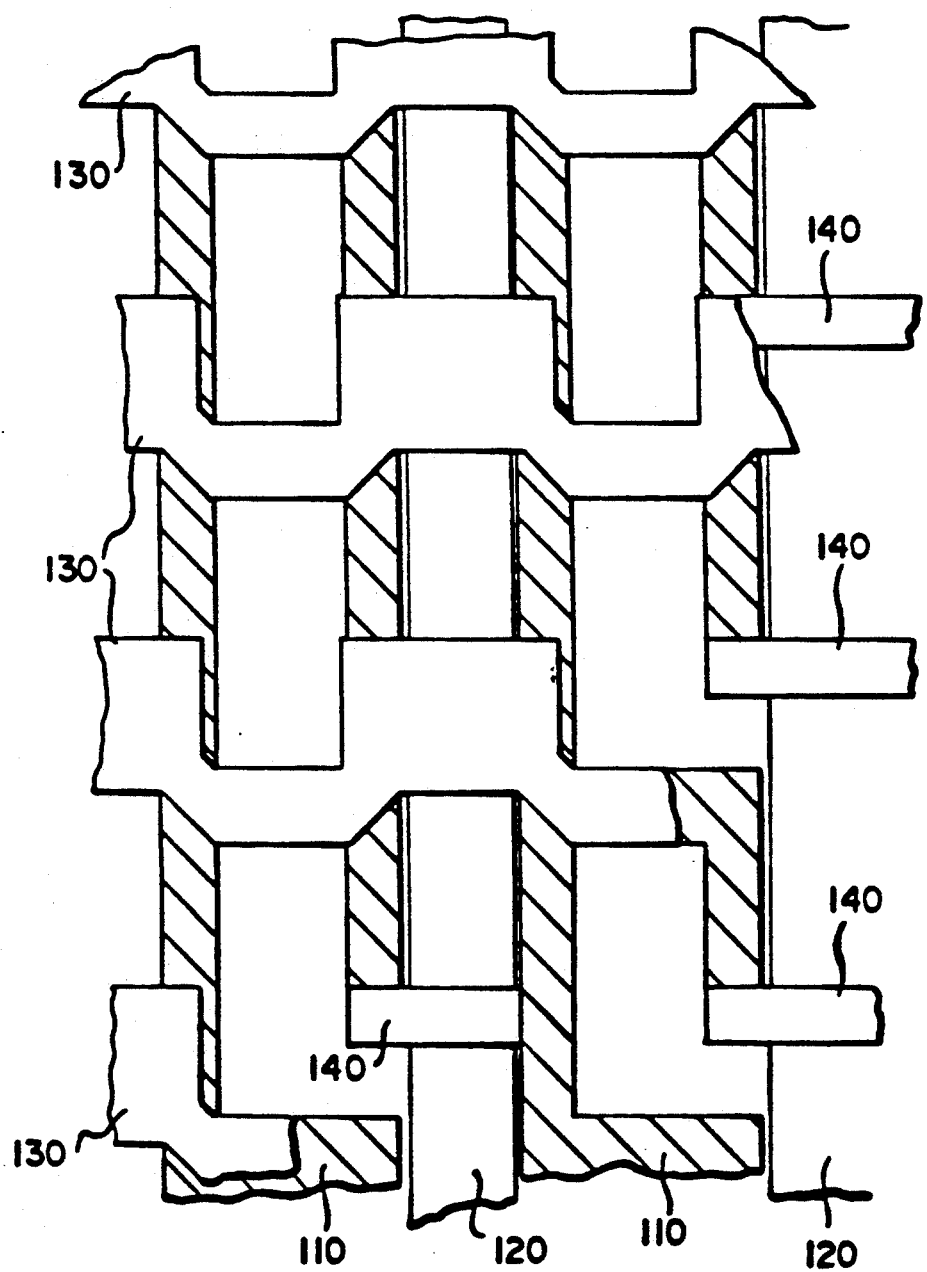
Figure 3C:
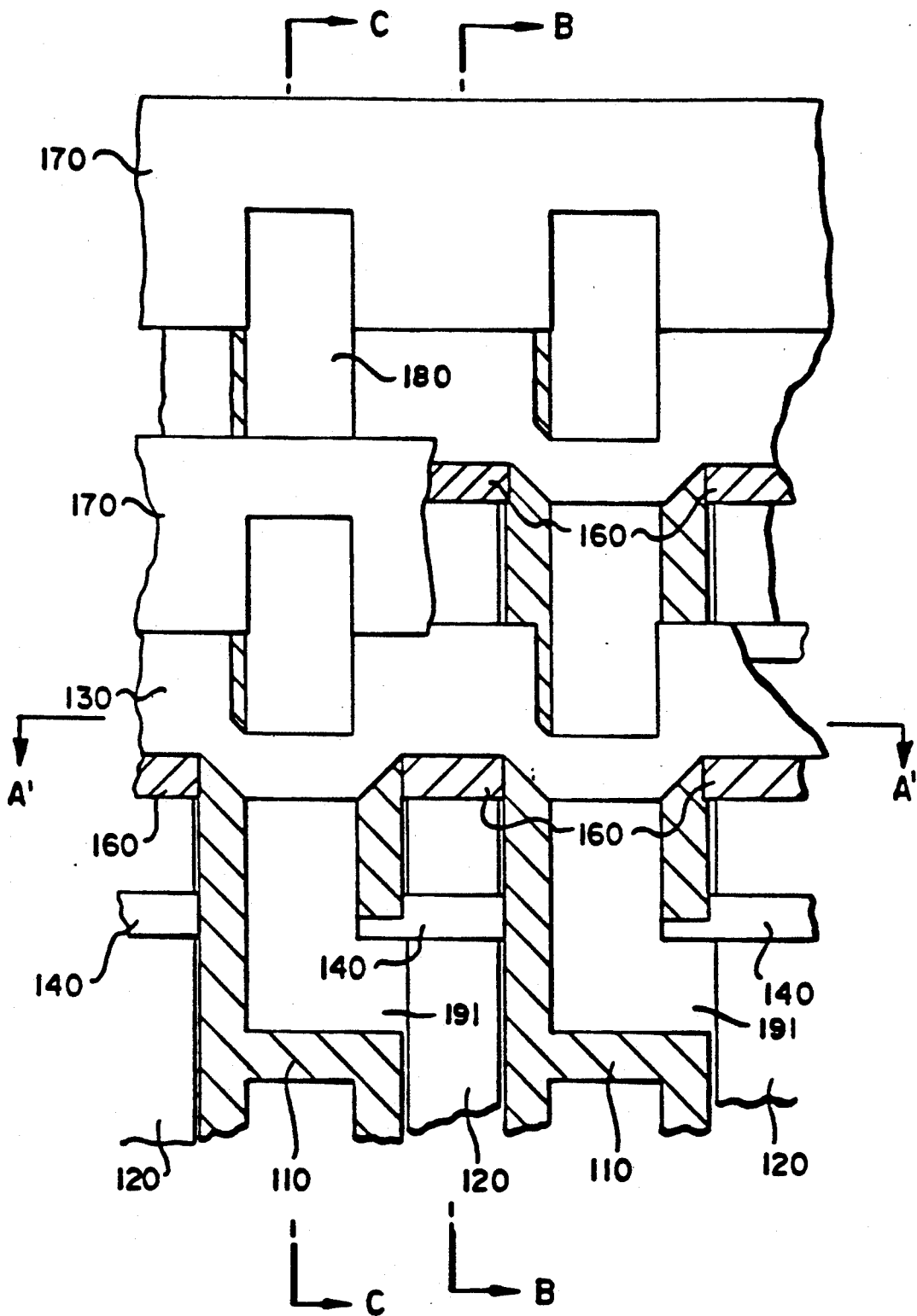
Figure 4A:
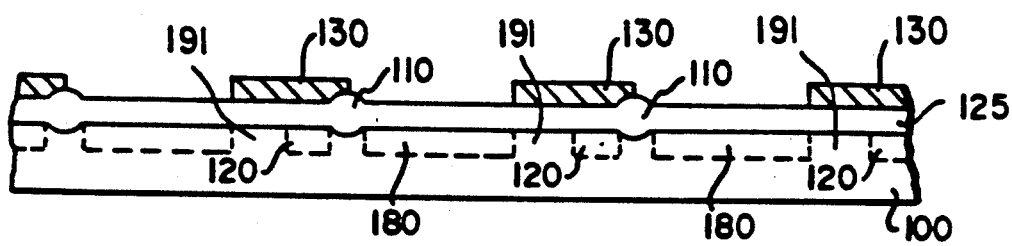
FIG. 4a, FIG. 4b and FIG. 4c are fragmentary, partially schematic cross sectional views taken along the lines A'—A', B—B and C—C of FIG. 3c, respectively.
Figure 4B:
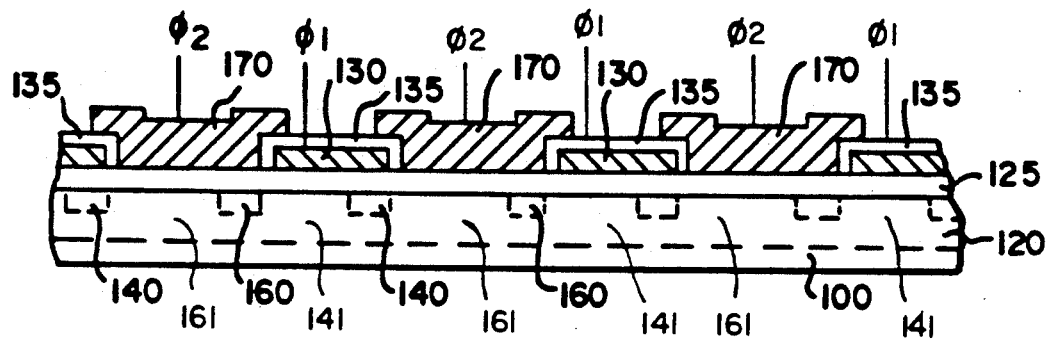
Figure 4C:
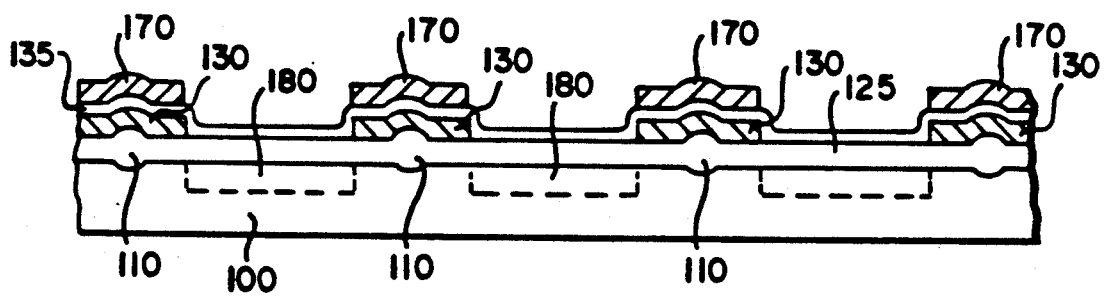

With reference to FIGS. 3a-c and 4a-c, an interline transfer type area image sensor has semiconductor substrate 100 provided with channel stop regions 110 and buried channel regions 120 as shown in plan view in FIG. 3a and in cross sectional views in FIG. 4. The substrate 100 may be a p-well diffused into an n-type silicon wafer. An insulating oxide 125 is grown over the semiconductor surface and a single level layer of polysilicon conductor 130 is deposited and patterned. Vertical transfer barrier regions are provided in regions 140 by methods such as described by Losee et al in U.S. Pat. No. 4,613,402, and illustrated in FIG. 3b. Turning now to FIG. 3c and FIG. 4b, an insulating layer of oxide 135 is grown over the polysilicon conductor 130 and a second set of vertical transfer barrier regions 160 is provided by ion implantation of appropriate dopant atoms. A second single level layer of polysilicon conductor is is deposited and patterned to form CCD electrodes 170 (see FIG. 4b). Also indicated in FIG. 4b are vertical shift register storage regions 141 and 161 which remain after formation of barrier regions 140 and 160. Regions 180, which are not covered with the polysilicon conductors, are then implanted with appropriate impurities to form rows and columns of charge collection sites to act as photoreceptors for collection of photogenerated charge.

FIG. 4a shows a cross section of a row of the interline area image sensor having photoreceptors 180. FIG. 4c shows in cross section a column of the interline area image sensor having photoreceptors 180. FIG. 4b is a cross section of one of the two-phase vertical CCD shift registers. Separate voltage clocks $\Phi_1$ and $\Phi_2$ are respectively connected to electrodes 130 and 170. As shown, the electrodes 170 overlap electrodes 130. To operate this device a positive going voltage pulse is applied to electrodes 130 which permits photogenerated charge from photoreceptors 180 to transfer to the buried channel storage regions 141 beneath electrodes 130 via the surface channel gap 191 (see FIG. 3a and FIG. 3b). It is emphasized at this point that photocharges from each row of photoreceptors have been transferred to vertical shift register storage regions 141 under electrodes 130 but that storage regions 161 under electrodes 170 remain empty. This is an essential feature of the invention which permits the separate integrity of the photocharges from each photoreceptor to be maintained. After this transfer of charge into the vertical CCD shift register, clock voltages $\Phi_1$ and $\Phi_2$ are applied to transfer the photocharges to horizontal shift register and an appropriate charge detection circuit in a well known manner. In this way each row of photoreceptors is read out sequentially and each row of photoreceptors 180 is associated with only one pair of electrodes 170 and 130.

In order to operate such a device in an electronically shuttered mode a voltage pulse is applied to simultaneously deplete all of the photoreceptor sites of any accumulated signal charge. For example, if substrate 100 is a p-well diffused into an n-type wafer, a voltage pulse applied between the p-well and the n-type wafer may be used to deplete the photoreceptor sites. After application of such a depleting pulse, photocharges are generated by absorption of incident light. Thereafter a suitable period of such light exposure, all accumulated photoreceptor photocharges are transferred simultaneously into the vertical CCD shift register and read out as described above.

Figure 5:
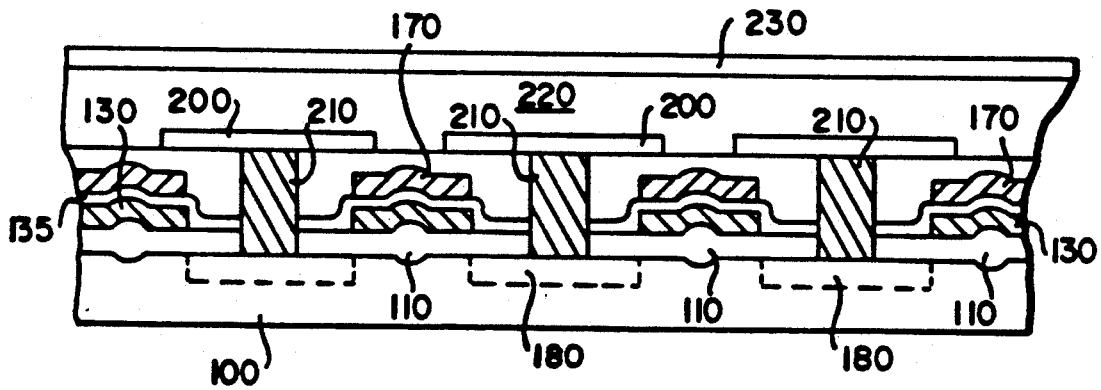
FIG. 5 is a fragmentary, partially schematic cross section view of an alternative embodiment of the present invention.

An alternative embodiment of this invention is shown schematically in FIG. 5. In this alternative embodiment the charge collection regions of the device, 180 are connected to capacitor plates 200 through a conducting pillar 210. Such a conducting pillar may be fabricated as described by Raley et al, J. Electrochemical Soc. 135, 2640 (1988). The capacitor plates are covered with a photoconducting layer 220 and top electrode layer 230. Photogenerated charge is transferred across the photoconductive layer and transferred to the charge collecting regions 180. This photocharge is then further transferred from regions 180 to the vertical shift register regions 141 and read out as described in the preceeding paragraph.

A third embodiment of the present invention is one where the conductive electrodes 130 and 170 of the figures are composed of composite layers of polysilicon covered with a metal silicide of the group consisting of $WSi_x$, $MoSi_x$, $TaSi_x$, $TiSi_x$, W, Mo, or Ta.

EXAMPLE

The following description gives an example of a device constructed according to this invention. An n-type semiconductor doped to approximately 30 ohm-cm resistivity was provided with a p-type region by implantation of boron atoms with a dose of $1.0E+12$ cm$^{}-2$ and diffused to a depth of thickness of approximately 3.5 $\mu$m. Channel stop barrier regions are formed by implantation of boron with a dose of $1.0E+13$ cm$^{}-2$, and subsequently growing an oxide of thickness approximately 4000 Å. An additional oxidation and subsequent etch-back reduces this oxide to a thickness of approximately 2500 Å. A buried channel region is formed by ion implantation of arsenic atoms, with a total dose 6.0E+12 cm$^{}-2$, and transfer gate oxide approximately 500 Å thick, is grown in the charge transfer region and over the photodiode regions. Polysilicon electrodes and edge aligned boron implanted barrier regions were then formed according to procedures described by Losee et al, U.S. Pat. No. 4,613,402, and phosphorus was implanted into the photodiode region with a dose of $4.0E+12$ cm$^{}-2$. A thin oxide layer was grown at a temperature of 950° C., in a wet ambient, for approximately 8 minutes. An insulating layer was deposited by chemical vapor deposition, consisting of approximately 1000 Å undoped oxide covered by 5000 Å of oxide doped with approximately 4 wt % boron and 4 wt % phosphorus. The device was subsequently annealed in an inert ambient for 30 minutes at a temperature of 900° C., contact openings were etched and an aluminum interconnect pattern was fabricated. The pixel dimensions of this device were 9.0 $\mu$m, horizontally, by 9.0 $\mu$m vertically.

INDUSTRIAL APPLICABILITY

For applications in electronic photography, image sensors of the interline transfer type with non-interlaced read-out sequence may be required. In interline transfer type image sensing devices, photogenerated charge is transferred from a pixel into a vertical CCD shift register. In the so-called interlaced read-out sequence alternate rows of pixels comprising one field are read out, one row at a time. Then, the second field, consisting of the remaining alternate rows of pixels, is read out. The vertical shift CCD register structure in such a device is composed of two or more overlapping levels of polysilicon electrodes associated with each row of pixels. For electronic photography, however, this interlaced read-out is frequently not desirable and a non-interlaced read-out, wherein photogenerated charge from each row is transferred in sequence, is preferred. In this disclosure, a non-interlaced interline transfer imaging device with simplified structure, and, hence improved manufacturability is described. The device utilizes two-phase vertical CCD shift registers with ion implanted barrier regions, which may be self-aligned, such as described by Losee et al U.S. Pat. No. 4,613,402, to produce a device with the minimum number of two polysilicon electrodes associated with each pixel. In addition to structural simplifications, the device also provides improved topography for application of integral color filter arrays and maximizes the photosensitive area.

The invention has been described in detail with particular reference to certain preferred embodiments thereof, but it will be understood that variations and modifications can be effected within the spirit and scope of the invention.

We claim:

1. An interline transfer type image sensor comprising: a semiconductor substrate having a surface;

a plurality of photoreceptors in the substrate at the surface and arranged in an array of at least one column;

a two-phase CCD shift register in the substrate and extending along the column of photoreceptors;

the shift register including first and second sets of electrodes extending thereacross with each of the electrodes of the first set alternating along the shift register with the electrodes of the second set so that one electrode of each set is disposed beside each of the photoreceptors and each photoreceptor is associated with a pair of electrodes formed by one electrode of each set;

the electrodes extend over the photoreceptors and have notches therein over the photoreceptors so as to expose at least a portion of the photoreceptors directly to light emanating from the image being sensed;

means electrically connecting the first set of electrodes to a first voltage clock;

means electrically connecting the second set of electrodes to a second voltage clock; and transfer means for transferring charge from each photoreceptor into a region under only an electrode of one of the sets of electrodes wherein photogenerated charge in each photoreceptor can be substantially simultaneously transferred to the CCD shift register and can be transferred along the shift register from each photoreceptor.

2. The image sensor device of claim 1 further comprising a channel stop region extending around each of the photoreceptors and having a gap therein along a portion of the photoreceptor between the photoreceptor and the shift register, the gap forming the transfer means for transferring charge from the photoreceptor to the shift register.

3. The image sensor device of claim 2 in which each of the electrodes of the one set of electrodes extends over the gap in the channel stop region of its adjacent photoreceptor.

4. The image sensor device of claim 3 further comprising in the CCD shift register a vertical transfer barrier region under an edge of each electrode.

5. The image sensor device of claim 4 in which each of the photoreceptors is a photodiode.

6. An interline transfer type area image sensor comprising:

a semiconductor substrate having a surface;

a plurality of photoreceptors in the substrate at the surface and arranged in an array of rows and columns;

a plurality of two-phase CCD shift registers in the substrate with each shift register extending along a separate column of the photoreceptors;

first and second sets of electrodes extending across the shift registers with each of the electrodes of the first set alternating along the shift registers with the electrodes of the second set so that one electrode of each set is disposed besides each of the photoreceptors in a column and each photoreceptor is associated with a pair of electrodes formed by one electrode of each set;

each of the electrodes extending across all of the photoreceptors in a row of the photoreceptors and having a notch therein over each photoreceptor in the row so as to expose at least a portion of each photoreceptor to light emanating from the image being sensed;

means electrically connecting the first set of electrodes to a first voltage clock;

means electrically connecting the second set of electrodes to a second voltage clock; and transfer means for transferring charge from each photoreceptor into a region of its adjacent shift register under only an electrode of one of the sets of electrodes wherein photogenerated charge in each photoreceptor can be transferred substantially simultaneously to the CCD shift registers and can be transferred along the shift registers while maintaining the integrity of photocharges from each photoreceptor element.

7. The interline transfer type area image sensor of claim 6 further comprising a channel stop region extending around each of the photoreceptors and having a gap therein along a portion of the photoreceptor between the photoreceptor and its adjacent shift register, the gaps forming the transfer means for transferring charge from the photoreceptors to the shift registers.

8. The interline transfer type area image sensor of claim 7 in which each of the electrodes of the one set of electrodes extends over a gap in the channel stop region of the photoreceptors in a row.

9. The interline transfer type area image sensor of claim 8 further comprising in each CCD shift register a vertical transfer barrier region under an edge of each electrode.

10. The interline transfer type area image sensor of claim 9 in which each of the photoreceptors is a photodiode.

* * * * *